US009171925B2

(12) United States Patent
Kuo et al.

(10) Patent No.: US 9,171,925 B2
(45) Date of Patent: Oct. 27, 2015

(54) MULTI-GATE DEVICES WITH REPLACED-CHANNELS AND METHODS FOR FORMING THE SAME

(75) Inventors: Chih-Wei Kuo, Tainan (TW); Yuan-Shun Chao, Hsin-Chu (TW); Hou-Yu Chen, Zhubei (TW); Shyh-Horng Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/457,258

(22) Filed: Apr. 26, 2012

(65) Prior Publication Data

US 2013/0285141 A1 Oct. 31, 2013

(51) Int. Cl.
*H01L 29/78* (2006.01)
*H01L 21/336* (2006.01)
*H01L 29/66* (2006.01)
*H01L 29/10* (2006.01)

(52) U.S. Cl.
CPC ...... *H01L 29/66545* (2013.01); *H01L 29/1054* (2013.01); *H01L 29/66795* (2013.01); *H01L 29/785* (2013.01)

(58) Field of Classification Search
CPC ..................... H01L 21/823431; H01L 21/845; H01L 21/823821; H01L 27/0886; H01L 27/0924; H01L 27/10826; H01L 27/10879; H01L 27/1211; H01L 29/41791; H01L 29/66772; H01L 29/66795; H01L 29/7831; H01L 29/785; H01L 29/1054; H01L 29/66545
USPC ........................... 257/368, E29.052, 347, 365
See application file for complete search history.

(56) References Cited

U.S. PATENT DOCUMENTS 6,720,619 B1 4/2004 Chen et al.
7,172,943 B2 * 2/2007 Yeo et al. ..................... 438/300
7,211,864 B2 * 5/2007 Seliskar ........................ 257/347
7,544,994 B2 * 6/2009 Schepis et al. ............... 257/327
7,612,405 B2 11/2009 Yu et al.
7,622,773 B2 * 11/2009 Irisawa et al. ................ 257/347
7,651,893 B2 1/2010 Chen et al.
7,714,384 B2 * 5/2010 Seliskar ........................ 257/331
7,728,324 B2 * 6/2010 Tezuka et al. .................. 257/29
7,812,370 B2 10/2010 Bhuwalka et al.

(Continued)

FOREIGN PATENT DOCUMENTS

KR 1020110098594 9/2011

OTHER PUBLICATIONS

Oxford Dictionaries, "substantially", Oxford Dictionaries, Apr. 2010, Oxford Dictionaries, definition/american_english/.*

*Primary Examiner* — Khiem D Nguyen
*Assistant Examiner* — Pauline Vu
(74) *Attorney, Agent, or Firm* — Slater & Matsil, L.L.P.

(57) ABSTRACT

A device includes a semiconductor substrate, isolation regions in the semiconductor substrate, and a Fin Field-Effect Transistor (FinFET). The FinFET includes a channel region over the semiconductor substrate, a gate dielectric on a top surface and sidewalls of the channel region, a gate electrode over the gate dielectric, a source/drain region, and an additional semiconductor region between the source/drain region and the channel region. The channel region and the additional semiconductor region are formed of different semiconductor materials, and are at substantially level with each other.

20 Claims, 15 Drawing Sheets

(56) References Cited

U.S. PATENT DOCUMENTS

| | | | | |
|---|---|---|---|---|
| 7,863,674 | B2 | 1/2011 | Yeo et al. | |
| 7,879,675 | B2 * | 2/2011 | Radosavljevic et al. | 438/268 |
| 7,972,914 | B2 | 7/2011 | Kim et al. | |
| 8,053,299 | B2 * | 11/2011 | Xu | 438/197 |
| 8,466,034 | B2 | 6/2013 | Maszara et al. | |
| 8,466,511 | B2 | 6/2013 | Oh | |
| RE44,431 | E * | 8/2013 | Pendse | 257/734 |
| 8,735,232 | B2 | 5/2014 | Baars et al. | |
| 2002/0003256 | A1 * | 1/2002 | Maegawa | 257/328 |
| 2002/0037619 | A1 * | 3/2002 | Sugihara et al. | 438/289 |
| 2002/0072197 | A1 | 6/2002 | Kang et al. | |
| 2005/0056888 | A1 * | 3/2005 | Youn et al. | 257/331 |
| 2005/0145932 | A1 * | 7/2005 | Park et al. | 257/328 |
| 2005/0224800 | A1 | 10/2005 | Lindert et al. | |
| 2005/0263795 | A1 * | 12/2005 | Choi et al. | 257/213 |
| 2007/0020879 | A1 | 1/2007 | Baek et al. | |
| 2007/0045736 | A1 * | 3/2007 | Yagishita | 257/347 |
| 2007/0063263 | A1 * | 3/2007 | Oh et al. | 257/316 |
| 2007/0210355 | A1 * | 9/2007 | Izumida | 257/288 |
| 2007/0235819 | A1 * | 10/2007 | Yagishita | 257/401 |
| 2008/0157172 | A1 * | 7/2008 | Lee | 257/321 |
| 2008/0299734 | A1 | 12/2008 | Lee et al. | |
| 2009/0230483 | A1 * | 9/2009 | Mizumura et al. | 257/401 |
| 2009/0267155 | A1 * | 10/2009 | Izumida et al. | 257/365 |
| 2009/0315112 | A1 * | 12/2009 | Lee | 257/355 |
| 2010/0052059 | A1 * | 3/2010 | Lee | 257/368 |
| 2010/0133614 | A1 * | 6/2010 | Beyer et al. | 257/347 |
| 2010/0163970 | A1 * | 7/2010 | Rakshit et al. | 257/327 |
| 2010/0207208 | A1 * | 8/2010 | Bedell et al. | 257/346 |
| 2010/0301391 | A1 | 12/2010 | Lochtefeld | |
| 2011/0031552 | A1 * | 2/2011 | Iwamatsu et al. | 257/347 |
| 2011/0095378 | A1 * | 4/2011 | Lee et al. | 257/401 |
| 2011/0108930 | A1 * | 5/2011 | Cheng et al. | 257/412 |
| 2011/0147811 | A1 * | 6/2011 | Kavalieros et al. | 257/288 |
| 2011/0147828 | A1 * | 6/2011 | Murthy et al. | 257/327 |
| 2011/0147842 | A1 * | 6/2011 | Cappellani et al. | 257/365 |
| 2011/0171795 | A1 * | 7/2011 | Tsai et al. | 438/232 |
| 2011/0193178 | A1 * | 8/2011 | Chang et al. | 257/408 |
| 2011/0210404 | A1 | 9/2011 | Su et al. | |
| 2011/0215375 | A1 * | 9/2011 | Cook et al. | 257/190 |
| 2011/0223736 | A1 * | 9/2011 | Lin et al. | 438/305 |
| 2011/0291196 | A1 * | 12/2011 | Wei et al. | 257/365 |
| 2011/0316080 | A1 * | 12/2011 | Luo et al. | 257/347 |
| 2012/0074464 | A1 * | 3/2012 | Cea et al. | 257/190 |
| 2012/0091528 | A1 * | 4/2012 | Chang et al. | 257/347 |
| 2012/0091538 | A1 * | 4/2012 | Lin et al. | 257/401 |
| 2012/0104472 | A1 * | 5/2012 | Xu et al. | 257/288 |
| 2012/0161238 | A1 * | 6/2012 | Scheiper et al. | 257/368 |
| 2012/0168817 | A1 | 7/2012 | Abou-Khalil et al. | |
| 2012/0211807 | A1 | 8/2012 | Yu et al. | |
| 2012/0261726 | A1 * | 10/2012 | Yang et al. | 257/288 |
| 2012/0299100 | A1 * | 11/2012 | Ota et al. | 257/347 |
| 2012/0319211 | A1 * | 12/2012 | van Dal et al. | 257/401 |
| 2013/0049140 | A1 * | 2/2013 | Asenov et al. | 257/411 |
| 2013/0099282 | A1 * | 4/2013 | Chen et al. | 257/190 |
| 2013/0134506 | A1 * | 5/2013 | Yagishita | 257/330 |
| 2013/0175584 | A1 * | 7/2013 | Ho et al. | 257/288 |
| 2013/0181264 | A1 | 7/2013 | Liao et al. | |
| 2013/0187206 | A1 | 7/2013 | Mor et al. | |
| 2013/0200455 | A1 * | 8/2013 | Lo et al. | 257/347 |
| 2013/0270628 | A1 * | 10/2013 | Huang et al. | 257/329 |

* cited by examiner

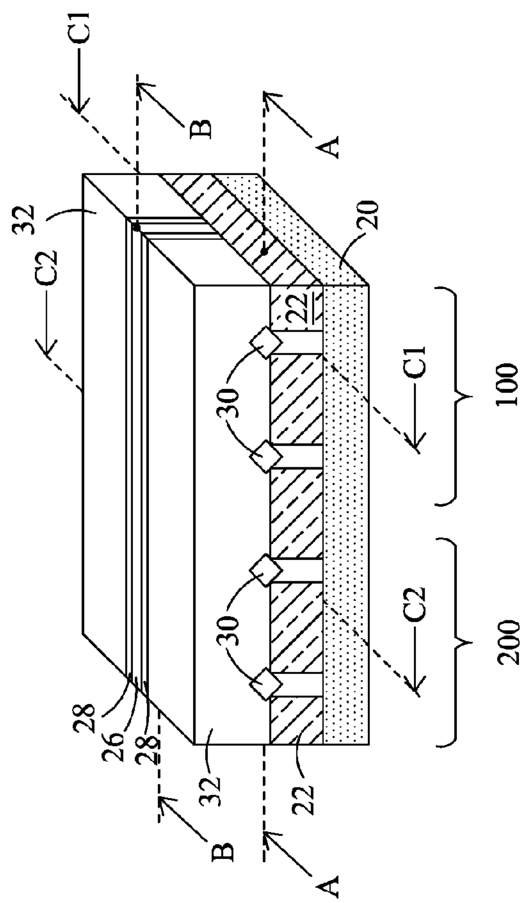
Fig. 7A
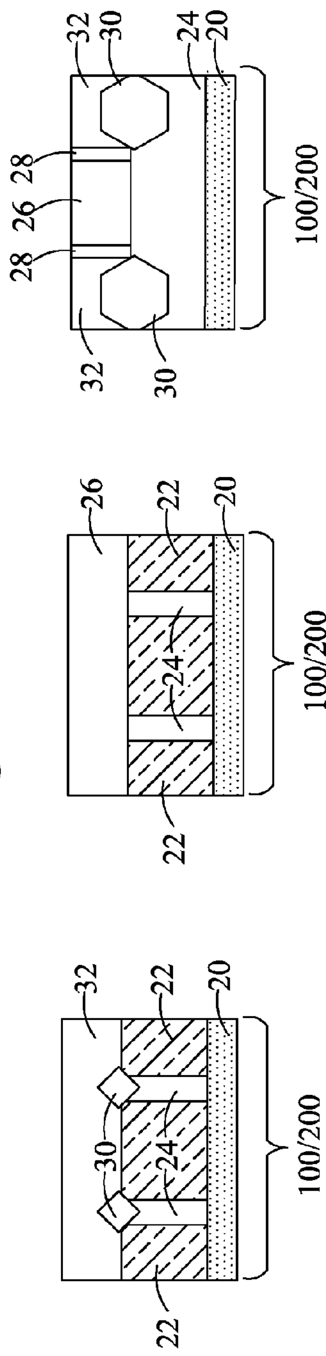
Fig. 7D
Fig. 7C
Fig. 7B

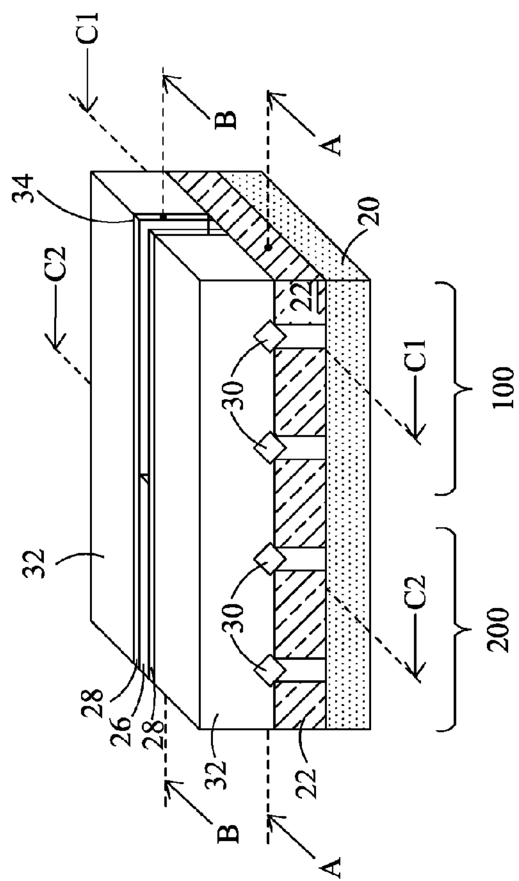
Fig. 8A
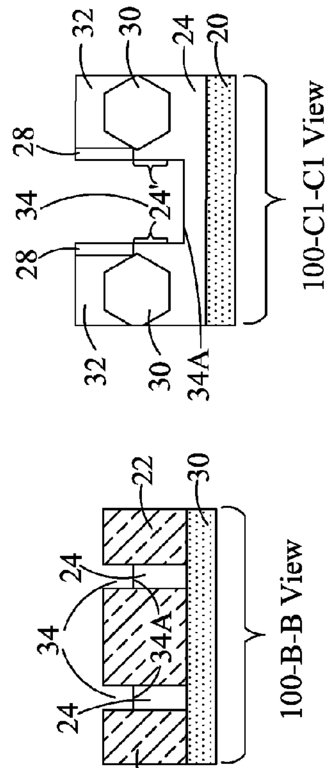
Fig. 8C
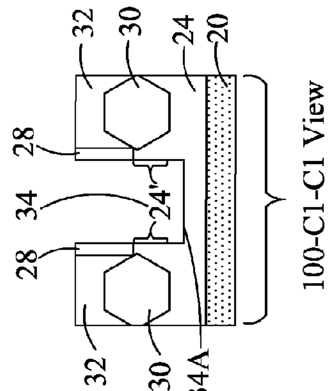
Fig. 8D
Fig. 8B

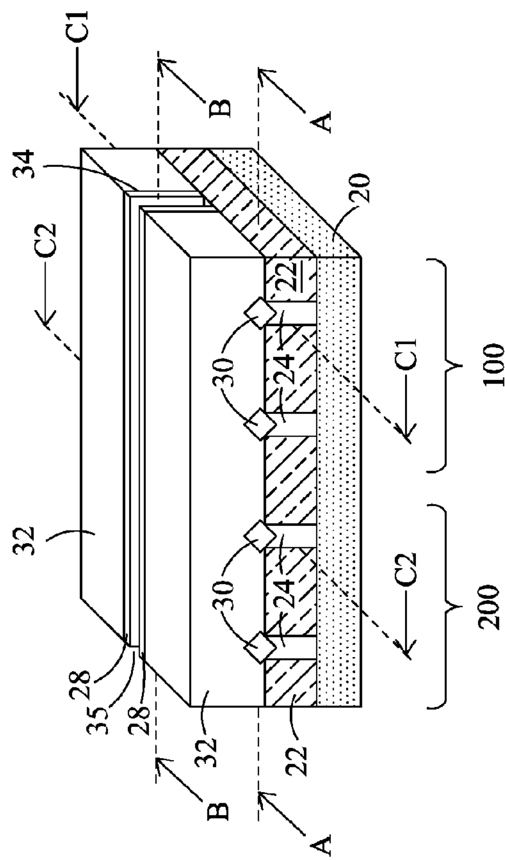
Fig. 10A
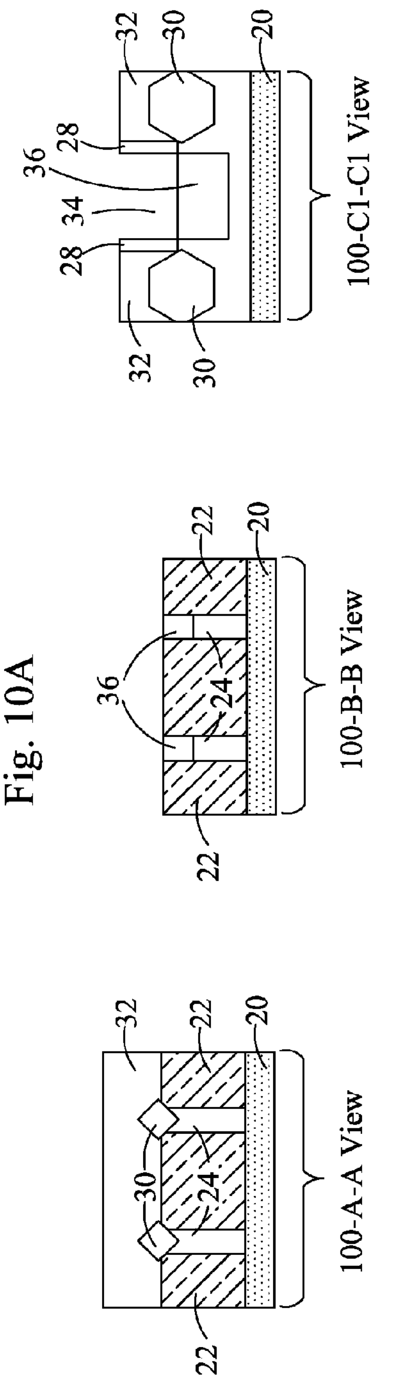
Fig. 10B
Fig. 10C
Fig. 10D

MULTI-GATE DEVICES WITH REPLACED-CHANNELS AND METHODS FOR FORMING THE SAME

CROSS-REFERENCE TO RELATED APPLICATION

This application relates to the following commonly-assigned co-pending U.S. patent application Ser. No. 13/356,769, filed Jan. 24, 2012, and entitled "FinFETs and Methods for Forming the Same;" which application is hereby incorporated herein by reference.

BACKGROUND

With the increasing down-scaling of integrated circuits and increasingly demanding requirements to the speed of integrated circuits, transistors need to have higher drive currents with smaller dimensions. Fin Field-Effect Transistors (FinFETs) were thus developed. FinFETs have increased channel widths. The increase in the channel widths is achieved by forming channels that include portions on the sidewalls of semiconductor fins and portions on the top surfaces of the semiconductor fins. Since the drive currents of transistors are proportional to the channel widths, the drive currents of the FinFETs are increased.

In an existing FinFET formation process, Shallow Trench Isolation (STI) regions are first formed in a silicon substrate. The STI regions are then recessed to form silicon fins, which comprise portions of the silicon substrate that are over the recessed STI regions. Next, a gate dielectric and a gate electrode are formed. A source and a drain region are then formed, for example, by recessing the silicon fin, and then performing an epitaxy. The epitaxy source and drain regions may have a lattice constant different from that of the respective silicon fin, and hence may provide a beneficial strain to the respective channel region of the FinFET. However, during the subsequent thermal processes, the strain may be relaxed. Furthermore, the impurities in the epitaxy source and drain regions may be adversely diffused into the channel in the subsequent thermal processes.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 13 are perspective views and cross-sectional views of intermediate stages in the manufacturing of Fin Field-Effect Transistors (FinFETs) in accordance with various exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Fin Field-Effect Transistors (FinFETs) and the methods of forming the same are provided in accordance with various embodiments. The intermediate stages of forming the FinFETs are illustrated. The variations of the embodiments are discussed. Throughout the various views and illustrative embodiments, like reference numbers are used to designate like elements.

Figure 1:
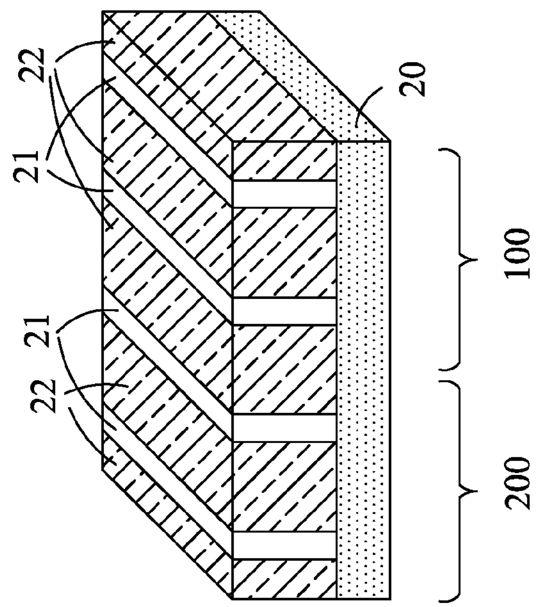

FIGS. 1 through 13 are cross-sectional views and perspective views of intermediate stages in the manufacturing of Fin Field-Effect Transistors (FinFETs) in accordance with some exemplary embodiments. FIG. 1 illustrates a perspective view of an initial structure. The initial structure includes substrate 20. Substrate 20 may be semiconductor substrate, which may further be a silicon substrate, a silicon germanium substrate, or a substrate formed of other semiconductor materials. Substrate 20 may be doped with a p-type or an n-type impurity. Isolation regions such as Shallow Trench Isolation (STI) regions 22 may be formed to extend from a top surface of substrate 20 into substrate 20. Substrate 20 includes a first portion in device region 100 and a second portion in device region 200. In some embodiments, one of the device regions 100 and 200 is a p-type FinFET region, and the other device region is an n-type FinFET region. The portions of substrate 20 between neighboring STI regions 22 form semiconductor strips 21. The top surfaces of semiconductor strips 21 and the top surfaces of STI regions 22 may be substantially level with each other.

Figure 2:
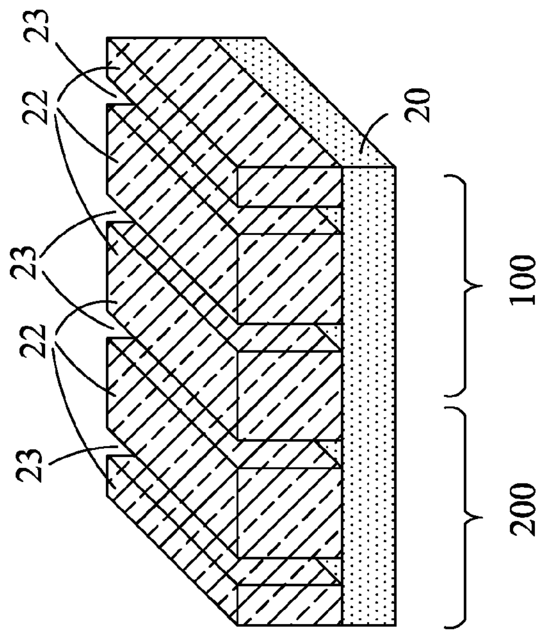
Figure 3:
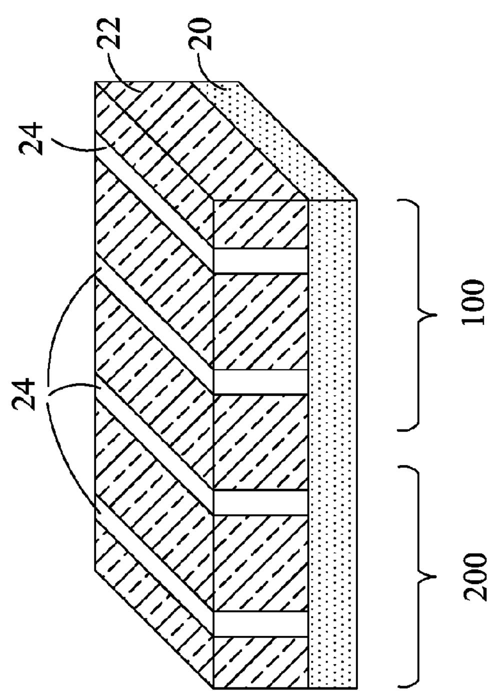

Referring to FIG. 2, at least upper portions, or substantially entireties, of semiconductor strips 21 are removed. Accordingly, recesses 23 are formed in STI regions 22. Next, as shown in FIG. 3, an epitaxy is performed to epitaxially grow semiconductor strips 24 in recesses 23. Semiconductor strips 24 may have a lattice constant greater than, substantially equal to, or smaller than, the lattice constant of substrate 20. In some embodiments, Semiconductor strips 24 comprise silicon germanium, silicon carbon, a III-V compound semiconductor, or the like. The top surface of the resulting semiconductor strips 24 may be higher than, level with, or lower than the top surface of STI regions 22.

In some embodiments, the process steps in FIGS. 2 and 3 are omitted, and semiconductor strips 21 remain. Accordingly, semiconductor strips 24 that are illustrated in subsequent drawings are actually semiconductor strips 21, which may be formed of a same semiconductor material as substrate 20.

Figure 4:
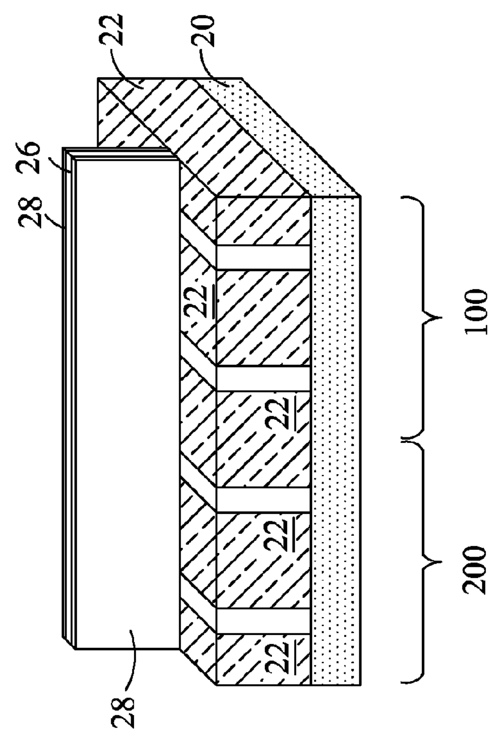

Referring to FIG. 4, dummy gate 26 is formed. Dummy gate 26 may be formed of, for example, polysilicon, although other materials that have a high etching selectivity from STI regions 22 may also be used. Dummy gate 26 is over portions of semiconductor strips 24, and may cross-over a plurality of semiconductor strips 24 and/or STI regions 22. Dummy gate 26 may also have a lengthwise direction substantially perpendicular to the lengthwise direction of semiconductor strips 24. Dummy gate 26 may include a portion in device region 100 and a portion in device region 200.

Next, as also shown in FIG. 4, gate spacers 28 are formed on the sidewalls of dummy gate 26. In some embodiments, gate spacers 28 comprise silicon oxide, silicon nitride, and the like, and may have a multi-layer structure.

Figure 6:
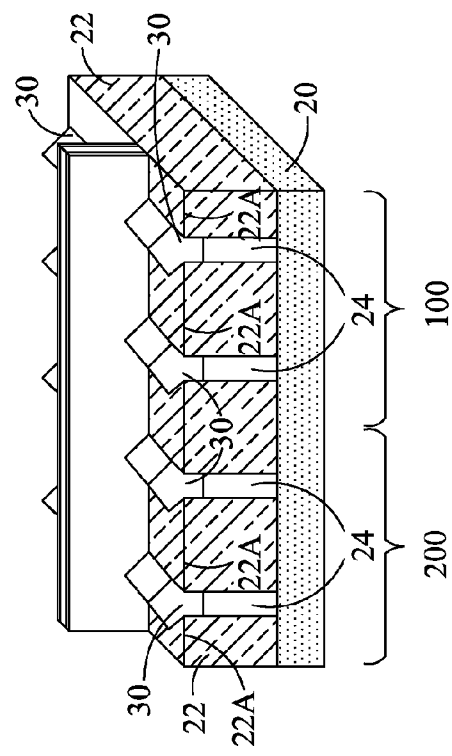
Figure 5:
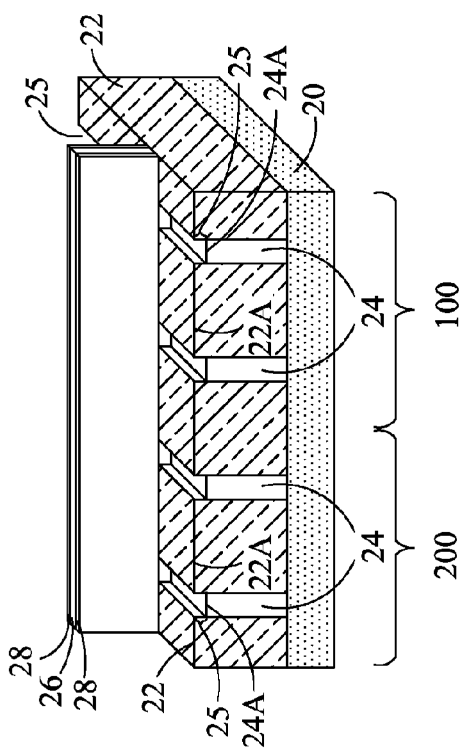

Referring to FIG. 5, an etching step is performed to etch portions of semiconductor strips 24 that are not covered by dummy gate 26 and gate spacers 28. The resulting top surfaces 24A of the recessed semiconductor strips 24 is thus lower than the top surfaces 22A of STI regions 22. Recesses 25 are accordingly formed between STI regions 22. Recesses 25 are located on opposite sides of dummy gate 26. Next, as shown in FIG. 6, epitaxy regions 30 are formed by selectively growing a semiconductor material in recesses 25. In some exemplary embodiments, epitaxy regions 30 comprise silicon germanium or silicon carbon. Alternatively, epitaxy regions 30 are formed of silicon, III-V semiconductor materials, or the like. After recesses 25 are filled with epitaxy regions 30, the further epitaxial growth of epitaxy regions 30 causes epitaxy regions 30 to expand horizontally, and facets start to form. Furthermore, some of top surfaces 22A of STI regions 22 are underlying and aligned to portions of epitaxy regions 30 due to the lateral growth of epitaxy regions 30. Alternatively, no recess of semiconductor strips 24 is performed, and epitaxy regions 30 are formed on the un-recessed semiconductor strips 24.

After the epitaxy step, epitaxy regions 30 may be implanted to form source and drain regions, which are also denoted using reference numeral 30. Source and drain regions 30 are on opposite sides of dummy gate 26, and may be overlying and overlapping portions of surfaces 22A of STI regions 22. When device regions 100 and 200 include an n-type FinFET region and a p-type FinFET region, the source/drain regions 30 in device regions 100 and 200 have opposite conductivity types. Following the formation of source and drain regions 30, source and drain silicide regions (not shown) may be formed by siliciding the top portions of source and drain regions 30. Alternatively, the source and drain silicide regions may be formed in the step shown in FIG. 13.

FIG. 7A illustrates a perspective view of the structure after Inter-Layer Dielectric (ILD) 32 is formed. A Chemical Mechanical Polish (CMP) may be performed to level the top surfaces of ILD 32, dummy gate 26, and gate spacers 28. FIG. 7B illustrates a cross-sectional view obtained from the plane crossing line A-A in FIG. 7A. FIG. 7C illustrates a cross-sectional view obtained from the plane crossing line B-B in FIG. 7A. FIG. 7D illustrates a cross-sectional view obtained from the plane crossing line C1-C1 or C2-C2 in FIG. 7A. The exemplary locations of regions 22, 24, 30, and 32 are also illustrated in the cross-sectional views.

FIGS. 8A through 12G illustrate the perspective views and the respective cross-sectional views in the further manufacturing steps of the FinFETs. Throughout FIGS. 8A through 12G, each of the Figures is marked with a number followed by a letter. The Figures with the same number are different views of a same process step and a same structure. In each of the cross-sectional views, the respective device region and the plane, from which the respective cross-sectional view is retrieved, are marked. For example, in FIG. 8B, "100—A-A View" is marked, indicating that the cross-sectional view is obtained from device region 100, and from the plane crossing line A-A in FIG. 8A.

Figure 8G:
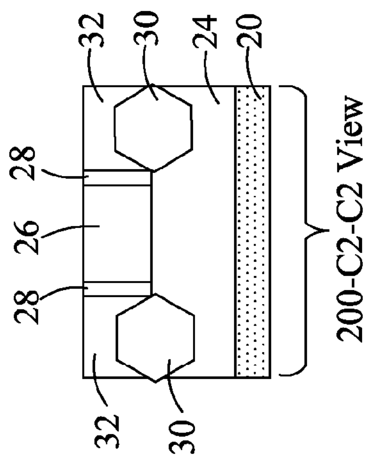

Referring to FIG. 8A, the portion of dummy gate 26 in device region 100 is removed, for example, through etching. The portion of dummy gate 26 in device region 200, however, remains not removed. FIGS. 8B through 8G are different views of the structure shown in FIG. 8A, wherein the removal of dummy gate 26 is illustrated in FIGS. 8C and 8D, and may be observed by comparing to FIGS. 7C and 7D, respectively. As shown in FIG. 8D, the removed portion of dummy gate 26 is at substantially a same level as gate spacers 28.

Figure 8F:
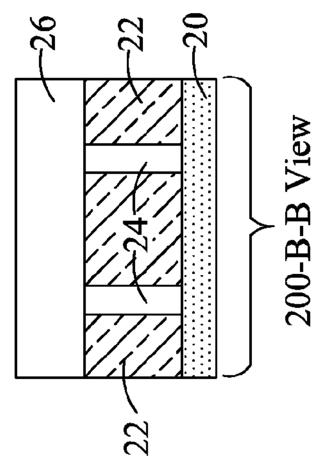
Figure 8E:
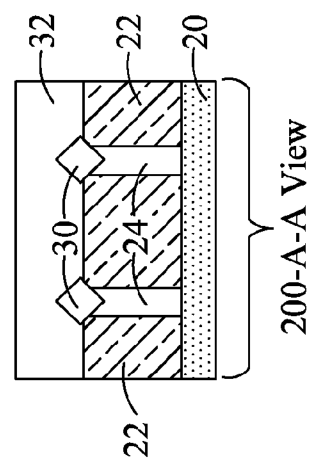

Referring to FIG. 8A, the removal of dummy gate 26 may be performed by forming a photo resist (not shown) to protect device region 200, and then etching dummy gate 26. Next, as shown in FIGS. 8C and 8D, the exposed semiconductor strips 24 are recessed, forming recesses 34 in STI regions 22. The recessing may comprise an anisotropic etching using gate spacers 28 as an etching mask, so that the sidewalls of recesses 34 are substantially vertical, and are substantially aligned to the edges of gate spacers 28. Bottoms 34A of recesses 34 may be higher than the bottom surfaces of semiconductor strips 24, and may be substantially level with, or slightly higher than, the bottoms of source/drain regions 30 (FIG. 8D). In some embodiments, as shown in FIG. 8D, semiconductor strips 24 may have portions 24' left unetched, with portions 24' having side edges exposed to recess 34. In FIGS. 8E, 8F, and 8G, which are the views of device region 200, however, dummy gate 26 and semiconductor strips 24 are not recessed.

Figure 9A:
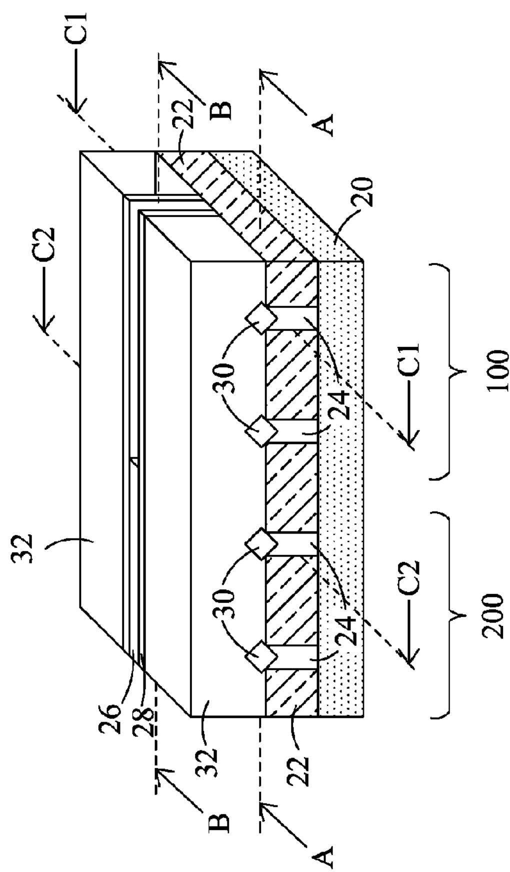
Figure 9D:
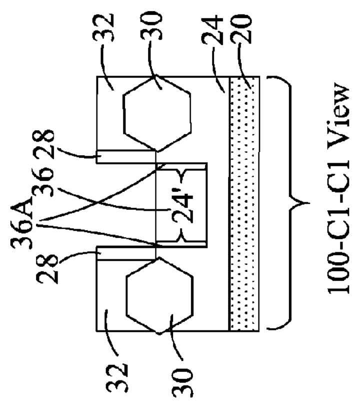
Figure 9C:
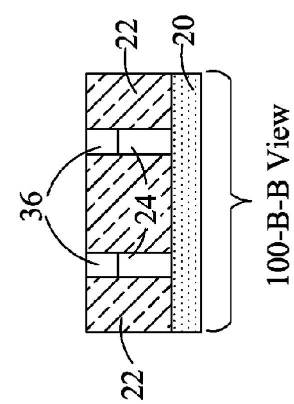
Figure 9B:
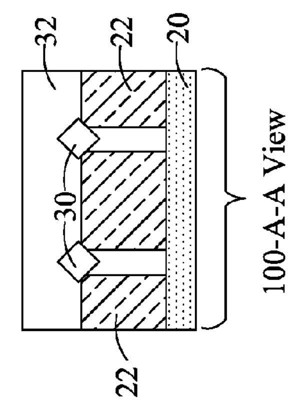
Figure 9G:
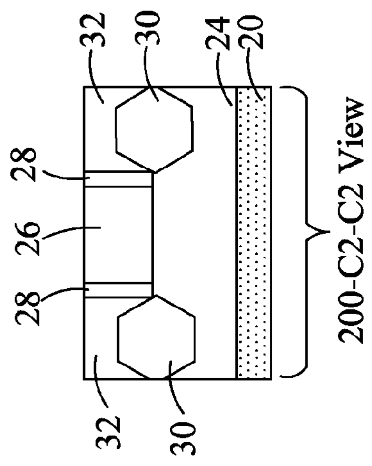
Figure 9F:
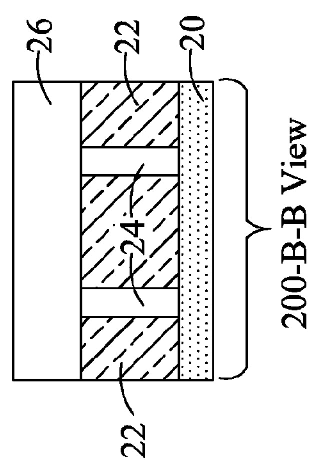
Figure 9E:
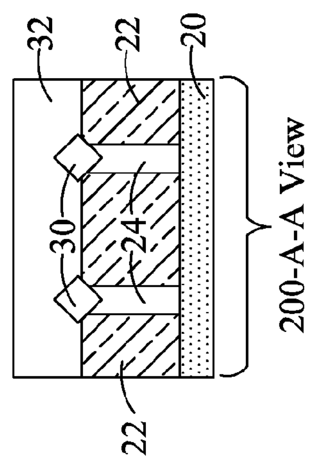

FIGS. 9A through 9D illustrate a perspective view and cross-sectional views in the formation of epitaxy semiconductor regions 36 (FIGS. 9C and 9D), which is formed by selective epitaxial growth. Epitaxy semiconductor regions 36 are grown from semiconductor strips 24, and are not grown on STI regions 22. As shown in FIG. 9D, epitaxy semiconductor regions 36 may have edges 36A (which are also the edges of portions 24') substantially aligned to the edges of gate spacers 28. It is appreciated that since epitaxy regions 36 and semiconductor strips 24 are formed in different process steps, there are visible and distinguishable interfaces (also shown as 36A) between epitaxy regions 36 and semiconductor strips 24. FIGS. 9E, 9F, and 9D illustrate the same process step. It is observed that when epitaxy semiconductor regions 36 are grown in device region 100, epitaxy semiconductor regions 36 are not grown in device region 200.

In some embodiments, epitaxy semiconductor regions 36 have a lattice constant greater than, substantially equal to, or smaller than, the lattice constant of semiconductor strips 24. For example, epitaxy semiconductor regions 36 may comprise silicon germanium, silicon carbon, III-V compound semiconductors, or the like. Furthermore, epitaxy semiconductor regions 36 and semiconductor strips 24 may include same elements that have different percentages. In some exemplary embodiments, epitaxy semiconductor regions 36 and semiconductor substrate 24 both comprise silicon germanium, and have different germanium percentages. The desirable material of epitaxy regions 36 are selected according to the desirable stress in the channel region of the FinFET in device region 100.

Figure 10G:
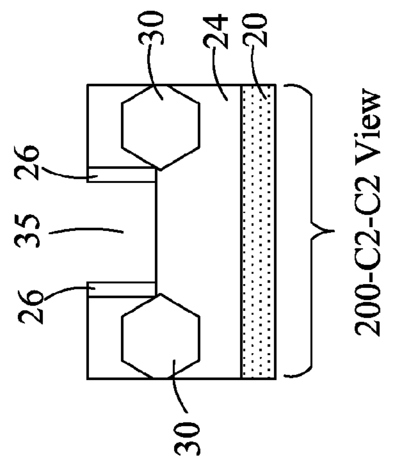
Figure 10F:
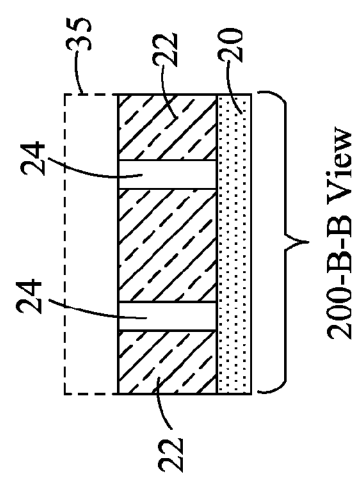
Figure 10E:
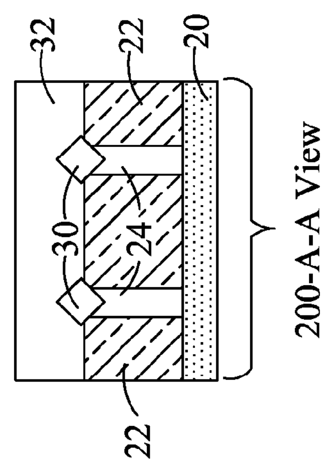

FIG. 10A and FIGS. 10B through 10G illustrate a perspective view and cross-sectional views in the removal of dummy gate 26 from device region 200. As shown in FIGS. 10F and 10G, dummy gate 26 is removed to form recess 35 in device region 200 and between gate spacers 28, and the underlying semiconductor strips 24 are exposed. The cross-sectional view shown in FIGS. 10B, 10C, and 10D remain the same as in FIGS. 9B, 9C, and 9D, respectively.

Figure 11A:
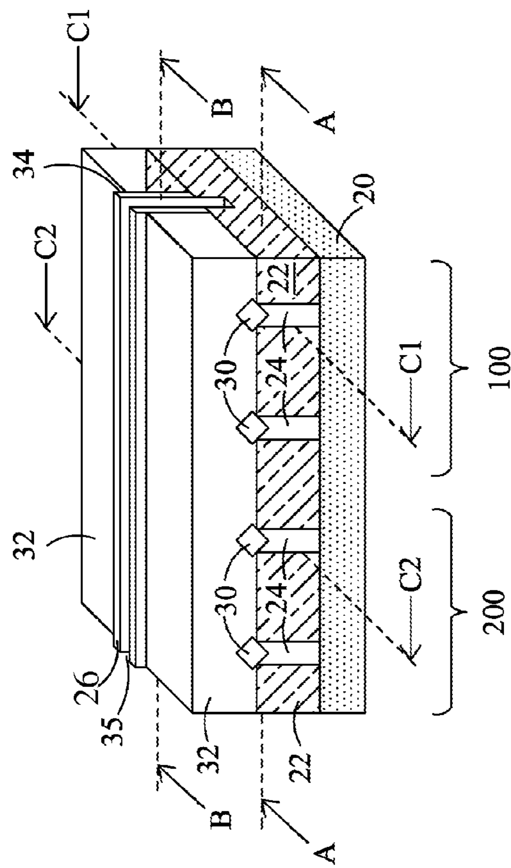
Figure 11D:
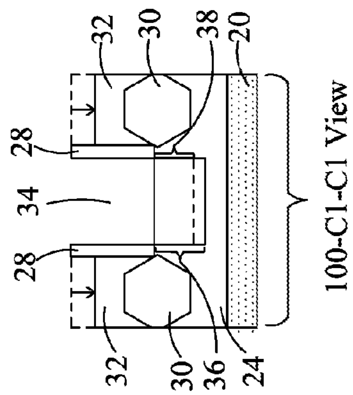
Figure 11C:
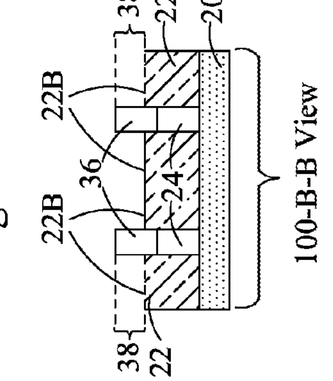
Figure 11B:
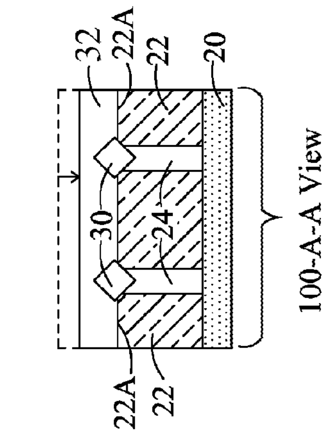
Figure 11G:
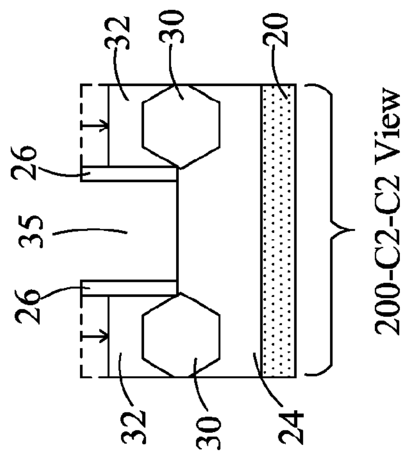
Figure 11F:
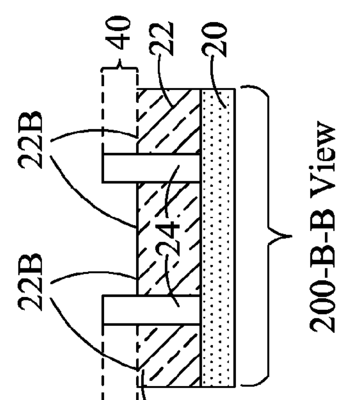
Figure 11E:
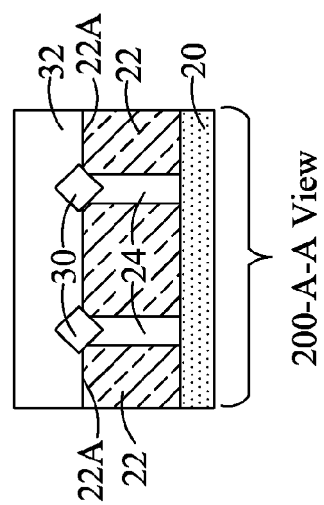

Next, referring to FIGS. 11A through 11G, in both device regions 100 and 200, an etching is performed to etch the portions of STI regions 22 underlying the removed dummy gate 26, so that epitaxy regions 36 (FIG. 11C) in device region 100 and semiconductor strips 24 (FIG. 11F) in device region 200 protrude over the respective adjoining STI regions 22. Throughout the description, the protruding portions of epitaxy regions 36 are referred to as semiconductor fins 38, and the protruding portions of semiconductor strips 24 are referred to as semiconductor fins 40. As a result of the etching, as shown in FIGS. 11B and 11E, some portions of STI regions 22 are not etched, and have top surfaces 22A, while portions of STI regions 22 that were previously underlying dummy gate 26 are recessed to have top surfaces 22B (FIGS. 11C and 11F). Top surfaces 22B are lower than top surfaces 22A by the height of semiconductor fins 38 and 40. Furthermore, top surfaces 22A may be substantially level with the top surfaces of semiconductor fins 38 and 40.

As shown in FIGS. 11D and 11G, at the time STI regions 22 are recessed, ILD 32 may also be recessed as a side effect. The recess of ILD 32 is shown by arrows. As a result of the etching of ILD 32, the top surface of ILD 32 may be lower than the top surface of gate spacers 28.

FIGS. 12A through 12G illustrate the formation of gate dielectrics 42 (including 142 and 242) and gate electrodes 44 (including 144 and 244). To form gate dielectrics 42 and gate electrodes 44, first, a gate dielectric layer is formed in recess 34 and 35 (FIG. 11A) and on the top surfaces and the sidewalls of semiconductor fins 38 and 40 (FIGS. 12C, 12D, 12F, and 12G). In accordance with some embodiments, the gate dielectric layer comprises silicon oxide, silicon nitride, or multilayers thereof. In alternative embodiments, the gate dielectric layer comprises a high-k dielectric material, and hence are high-k gate dielectrics. The high-k gate dielectric layer may have a k value greater than about 7.0, and may include a metal oxide or a silicate of Hf, Al, Zr, La, Mg, Ba, Ti, Pb, and combinations thereof. The formation methods of the gate dielectric layer may include Molecular-Beam Deposition (MBD), Atomic Layer Deposition (ALD), Physical Vapor Deposition (PVD), and the like.

Next, a conductive material, which is used to form gate electrodes 44, is formed over the gate dielectric layer, and fills the remaining recesses 34 and 35 (FIG. 11A). After the filling of the conductive material, a CMP may be performed to remove the excess portions of the gate dielectric layer and the conductive material over the top surface of ILD 32. In the CMP, portions of gate spacers 28 are also polished, as illustrated by the arrow in FIG. 12D, and the top surfaces of gate spacers 28, ILD 32, gate dielectrics 42, and gate electrodes 44 are level with each other. Gate electrodes 44 may comprise a metal-containing material such as TiN, TaN, TaC, Co, Ru, Al, combinations thereof, and multi-layers thereof.

Figure 12A:
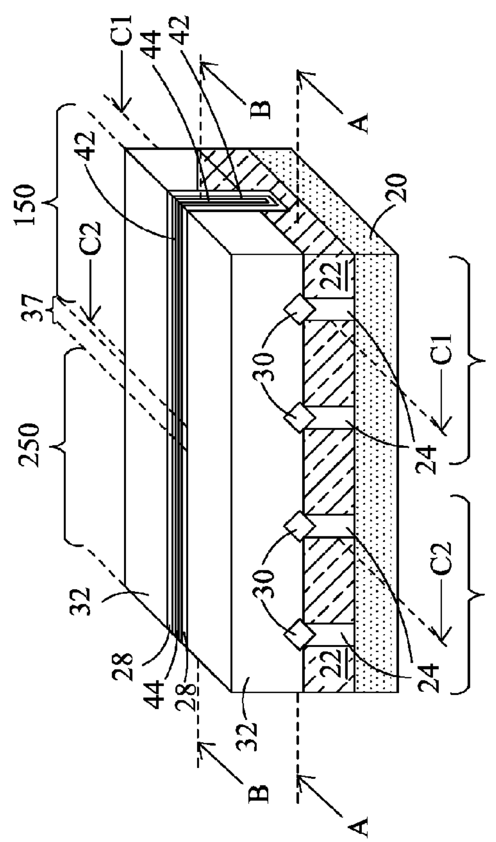
Figure 12B:
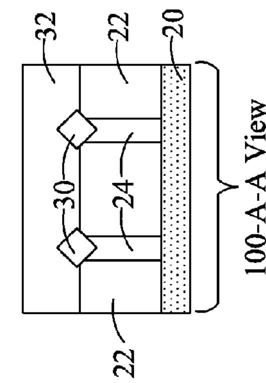
Figure 12C:
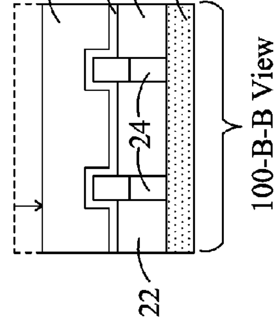
Figure 12D:
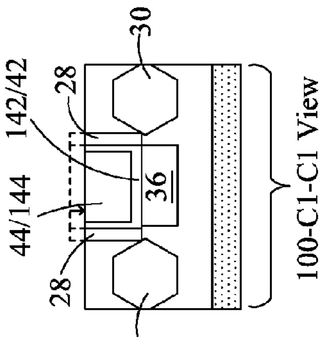
Figure 12G:
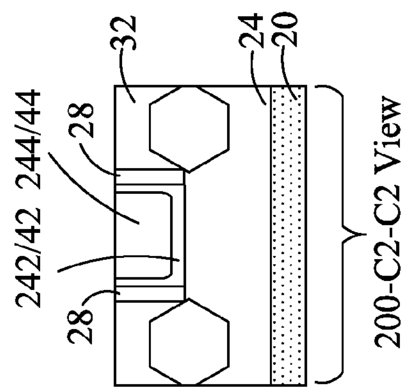
Figure 12F:
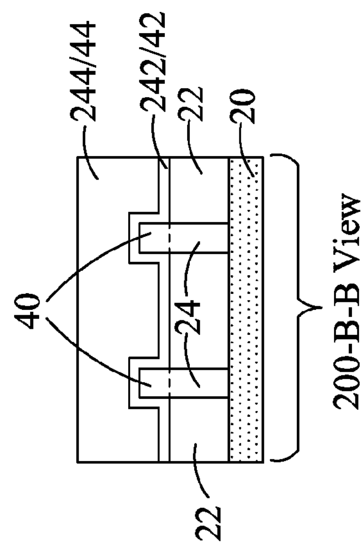
Figure 12E:
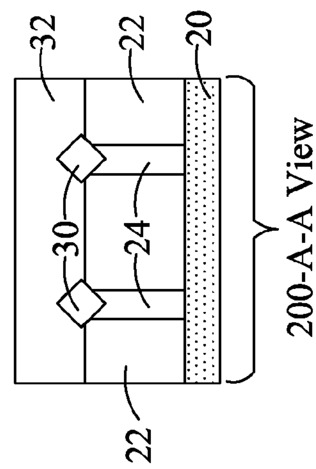

A patterning step may further be performed to remove the portions of the gate dielectric layer and the conductive material in region 37 (FIG. 12A). As a result, gate dielectrics 142 and 242 are separated from each other, and gate electrodes 144 and 244 are separated from each other. Accordingly, FinFETs 150 and 250 are formed in device regions 100 and 200, respectively. FinFET 150 includes gate dielectric 142 and gate electrode 144 (FIGS. 12C and 12D). FinFET 250 includes gate dielectric 242 and gate electrode 244 (FIGS. 12F and 12G). Gate electrodes 144 and 244 are referred to replacement gates hereinafter since they are formed by replacing dummy gate 26. Due to the replacement gate formation, gate dielectrics 142 and 242 have top edges level with the top surfaces of gate electrodes 144 and 244.

Figure 13:
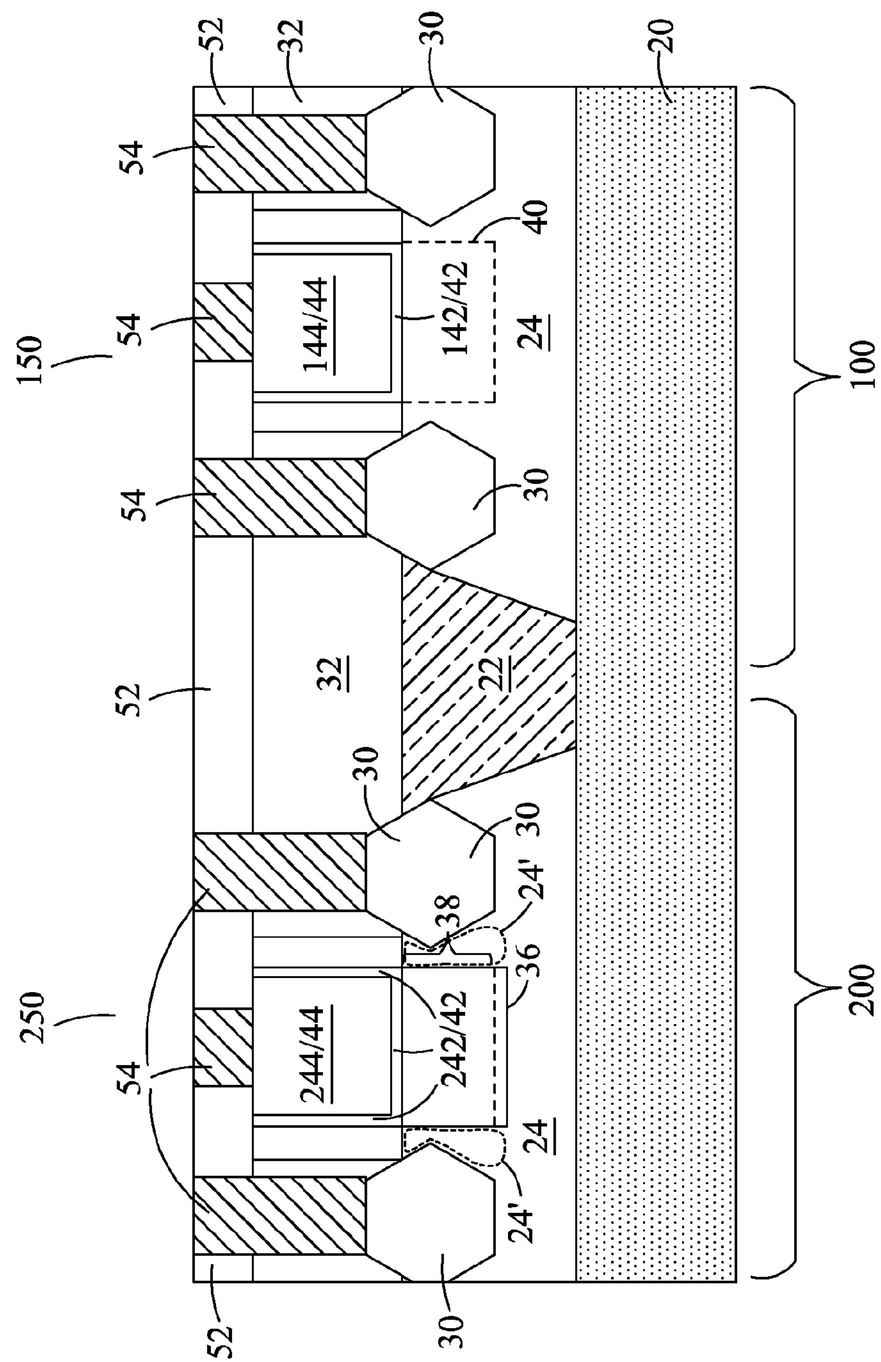

FIG. 13 schematically illustrates cross-sectional views of FinFETs 150 and 250. It is appreciated that the cross-sectional views of FinFETs 150 and 250 are shown as being in a same plane in FIG. 13, although they are actually in different planes crossing lines C1-C1 and C2-C2, respectively, in FIG. 12A. In subsequent process steps, an additional ILD 52 is formed over ILD 32, and contact plugs 54 may be formed to penetrate through ILDs 32 and 52 to electrically couple to gate electrode 44 and source/drain silicide regions (not shown). ILD 52 and ILD 32 may be formed of a same dielectric material or different dielectric materials. A visible interface may be generated between ILD 52 and ILD 32 regardless of whether they are formed of a same material or different materials.

It is observed that in the resulting FinFETs 150, the STI regions 22 that are on opposite sides of a same gate electrode 144 (FIGS. 11B and 11E) have top surfaces 22A that are higher than top surface 22B (FIGS. 11C and 11F), which are underlying (and aligned to) gate electrodes 44. This is different from the conventional FinFETs. In the conventional FinFETs, the STI regions 22 that are on the opposite sides of a gate electrodes have top surfaces that are level with the top surface of the portion of the STI region that is underlying (and aligned to) the respective gate electrode. In addition, in FIGS. 11C and 11F, top surfaces 22A of STI regions 22 that are on the opposite sides of a same epitaxy source/drain region 30 are substantially level with the top surfaces of semiconductor fins 38, as shown in FIGS. 11C and 11F. This is also different from the conventional FinFETs, in which the top surfaces of the STI regions that are on the opposite sides of a same epitaxy source/drain region are lower than the respective semiconductor fin of the respective FinFET.

In addition, referring to FIG. 13, due to the formation of replacement channel 38, which is formed by replacing the original semiconductor strips 24, semiconductor strips 24 may include extending portions 24' extending between semiconductor fin 38 (which also forms the channel region) and source/drain regions 30, wherein portions 24' are formed of a material different from the materials of both semiconductor fin 38 and source/drain region 30.

Further referring to FIG. 13, each of FinFETs 150 and 250 may be a p-type FinFET or an n-type FinFET. The respective materials of semiconductor strips 24 and semiconductor regions 36 are selected to generate desirable strains for the respective FinFETs 150 and 250. For example, for a p-type FinFET, a compressive stress is generated in the respective channel region (the fins 38 or 40 in FIGS. 11C and 11F, respectively). For an n-type FinFET, a tensile strain is generated in the respective channel regions 38 or 40. In some exemplary embodiments, FinFET 150 is a p-type FinFET, and semiconductor strips 24 may comprise silicon, germanium, silicon germanium, III-V compound semiconductor materials, or the like. FinFET 250 is an n-type FinFET, and semiconductor region 36 may comprise silicon, silicon germanium, germanium, III-V compound semiconductor, or the like.

In accordance with embodiments, a device includes a semiconductor substrate, isolation regions in the semiconductor substrate, and a FinFET. The FinFET includes a channel region over the semiconductor substrate, a gate dielectric on a top surface and sidewalls of the channel region, a gate electrode over the gate dielectric, a source/drain region, and an additional semiconductor region between the source/drain region and the channel region. The channel region and the additional semiconductor region are formed of different semiconductor materials, and are at substantially level with each other.

In accordance with other embodiments, a device includes a semiconductor substrate, isolation regions in the semiconductor substrate, and a FinFET. The FinFET includes a semiconductor strip, wherein opposite edges of the semiconductor strip are in contact with opposite sidewalls of the isolation regions, and a semiconductor channel over top surfaces of the isolation regions and overlapping a first portion of the semiconductor strip. The semiconductor channel and the semiconductor strip include different materials. A source/drain region is disposed adjacent the semiconductor channel. The semiconductor strip further includes a second portion extending between the semiconductor channel and the source/drain region, and wherein the second portion has an edge contacting an edge of the semiconductor channel.

In accordance with yet other embodiments, a method includes forming isolation regions extending from a top surface of a semiconductor substrate into the semiconductor substrate, wherein the isolation regions have a first top surface, and wherein a portion of the semiconductor substrate between two neighboring ones of the isolation regions forms a semiconductor strip. The method further includes forming a dummy gate over the semiconductor strip and the isolation regions, removing the dummy gate, etching a portion of the semiconductor strip under the dummy gate to form a first recess in the semiconductor strip, and performing an epitaxy to grow an epitaxy semiconductor region in the first recess. A portion of the isolation regions under the dummy gate is recessed to form a second recess, wherein a recessed portion of the isolation regions has a second top surface lower than the first top surface. A portion of the epitaxy semiconductor region exposed through the recess forms a semiconductor fin that is over the second top surface of the isolation regions.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a semiconductor substrate;
isolation regions in the semiconductor substrate;
a Fin Field-Effect Transistor (FinFET) comprising:
a channel region over the semiconductor substrate;
a gate dielectric on a top surface and sidewalls of the channel region;
a gate electrode over the gate dielectric;
a source/drain region; and
a semiconductor region comprising:
a first portion between the source/drain region and the channel region; and
a second portion underlying the source/drain region and the channel region, the first portion and the second portion continuously connected to each other, with no distinguishable interface therebetween, wherein group IV elements and respective percentages of the group IV elements in the channel region are different from group IV elements and respective percentages of the group IV elements in the first portion of the semiconductor region.

2. The device of claim 1, wherein group IV elements and respective percentages of the group IV elements in the source/drain region are different from the group IV elements and the respective percentages of the group IV elements in the first portion of the semiconductor region.

3. The device of claim 1, wherein the isolation regions comprise:
first portions on opposite sides of the source/drain region, wherein the first portions of the isolation regions have first top surfaces; and
second portions on opposite sides of the channel region, wherein the second portions of the isolation regions have second top surfaces lower than the first top surfaces.

4. The device of claim 3, wherein the first top surfaces of the isolation regions are level with a top surface of the channel region.

5. The device of claim 1 further comprising:
a first Inter-Layer Dielectric (ILD) over the source/drain region; and
a second ILD over the first ILD, wherein an interface between the first ILD and the second ILD is level with a top surface of the gate electrode.

6. The device of claim 1, wherein an interface between the channel region and the first portion of the semiconductor region is aligned to an edge of the gate dielectric.

7. A device comprising:
a semiconductor substrate;
isolation regions in the semiconductor substrate; and
a Fin Field-Effect Transistor (FinFET) comprising:
a semiconductor channel over the semiconductor substrate formed of a first semiconductor material;
a source/drain region adjacent the semiconductor channel formed of a second semiconductor material; and
a semiconductor region formed of a third semiconductor material comprising:
a first portion extending between the semiconductor channel and the source/drain region; and
a second portion underlying the semiconductor channel and the source/drain region, the first portion and the second portion continuously connected to each other, with no distinguishable interface therebetween, wherein the first semiconductor material, the second semiconductor material, and the third semiconductor material are different from one another.

8. The device of claim 7, wherein portions of the isolation regions adjoining the semiconductor channel have first top surfaces, and wherein other portions of the isolation regions adjoining the source/drain region have second top surfaces higher than the first top surfaces.

9. The device of claim 8, wherein the second top surfaces are level with a top surface of the semiconductor channel.

10. The device of claim 7, wherein the first semiconductor material comprises silicon germanium.

11. The device of claim 7, further comprising:
a gate electrode over the semiconductor channel; and
a first Inter-Layer Dielectric (ILD) and a second ILD over the first ILD, wherein an interface of the first and the second ILDs is level with a top surface of the gate electrode.

12. The device of claim 10, wherein the third semiconductor material is free from germanium.

13. The device of claim 7, wherein the first semiconductor material comprises a III-V compound semiconductor material.

14. The device of claim 7, wherein the second semiconductor material comprises germanium.

15. The device of claim 7, wherein the first semiconductor material is a homogenous material.

16. A device comprising:
a semiconductor substrate;
isolation regions extending into the semiconductor substrate;
a Fin Field-Effect Transistor (FinFET) comprising:
a channel region over the semiconductor substrate, wherein the channel region comprises a first silicon germanium having a first germanium percentage;
a source/drain region; and
an additional semiconductor region between the source/drain region and the channel region, wherein the additional semiconductor region comprises a second silicon germanium having a second germanium percentage different from the first germanium percentage; and a semiconductor strip over the semiconductor substrate, wherein the semiconductor strip is underlying the channel region, the additional semiconductor region, and the source/drain region, wherein the semiconductor strip comprises the second silicon germanium having the second germanium percentage, and wherein the additional semiconductor region and the semiconductor strip are continuously connected to each other, with no distinguishable interface therebetween.

17. The device of claim 16, wherein the isolation regions comprise a first top surface and a second top surface higher than the first top surface, and wherein the device further comprises a gate stack comprising:

a gate dielectric on a top surface and sidewalls of the channel region; and a gate electrode over the gate dielectric, wherein the gate dielectric and the gate electrode comprise portions higher than the first top surface and lower than the second top surface.

18. The device of claim 17, wherein the source/drain region comprises a lower portion having sidewalls between and contacting sidewalls of two of the isolation regions, and wherein the two of the isolation regions comprise top surfaces level with the second top surface of the isolation regions.

19. The device of claim 1, wherein the group IV elements and the respective percentages of the group IV elements in the channel region are different from group IV elements and respective percentages of the group IV elements in the source/drain region.

20. A device comprising:

a semiconductor substrate;

isolation regions in the semiconductor substrate;

a Fin Field-Effect Transistor (FinFET) comprising:

a channel region over the semiconductor substrate, wherein the channel region comprises germanium;

a gate dielectric on a top surface and sidewalls of the channel region;

a gate electrode over the gate dielectric;

a source/drain region; and a semiconductor region comprising a first portion between the source/drain region and the channel region, wherein the first portion comprises silicon and is free from germanium, and wherein group IV elements and respective percentages of the group IV elements in the channel region are different from group IV elements and respective percentages of the group IV elements in the first portion of the semiconductor region.

* * * * *